United States Patent

Chapman et al.

[11] Patent Number: 5,866,509
[45] Date of Patent: Feb. 2, 1999

[54] MAGENTA DYE MIXTURE FOR THERMAL COLOR PROOFING

[75] Inventors: Derek D. Chapman, Rochester; Linda A. Kaszczuk, Webster; Joseph H. Ambro, Rochester, all of N.Y.

[73] Assignee: Eastman Kodak Company, Rochester, N.Y.

[21] Appl. No.: 920,921

[22] Filed: Aug. 29, 1997

[51] Int. Cl.$^6$ .............................. B41M 5/035; B41M 5/38
[52] U.S. Cl. .......................... 503/227; 428/195; 428/913; 428/914
[58] Field of Search ................................ 8/471; 428/195, 428/913, 914; 503/227

[56] References Cited

U.S. PATENT DOCUMENTS 5,023,229  6/1991  Evans et al. ............................ 503/227
5,234,887  8/1993  Gregory et al. ........................ 503/227

*Primary Examiner*—Bruce H. Hess
*Attorney, Agent, or Firm*—Harold E. Cole

[57] ABSTRACT

A magenta dye-donor element for thermal dye transfer comprises a support having thereon a dye layer comprising a mixture of magenta dyes dispersed in a polymeric binder, at least one of the magenta dyes having the formula:

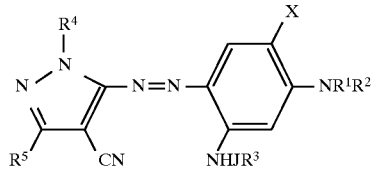

and at least another of the magenta dyes having the formula:

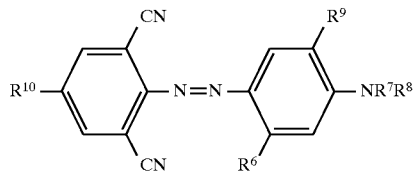

20 Claims, No Drawings

MAGENTA DYE MIXTURE FOR THERMAL COLOR PROOFING

FIELD OF THE INVENTION

This invention relates to use of a mixture of dyes in a magenta dye-donor element for thermal dye transfer imaging which is used to obtain a color proof that accurately represents the hue of a printed color image obtained from a printing press.

BACKGROUND OF THE INVENTION

In order to approximate the appearance of continuous-tone (photographic) images via ink-on-paper printing, the commercial printing industry relies on a process known as halftone printing. In halftone printing, color density gradations are produced by printing patterns of dots or areas of varying sizes, but of the same color density, instead of varying the color density continuously as is done in photographic printing.

There is an important commercial need to obtain a color proof image before a printing press run is made. It is desired that the color proof will accurately represent at least the details and color tone scale of the prints obtained on the printing press. In many cases, it is also desirable that the color proof accurately represent the image quality and halftone pattern of the prints obtained on the printing press. In the sequence of operations necessary to produce an ink-printed, full-color picture, a proof is also required to check the accuracy of the color separation data from which the final three or more printing plates or cylinders are made. Traditionally, such color separation proofs have involved silver halide photographic, high-contrast lithographic systems or non-silver halide light-sensitive systems which require many exposure and processing steps before a final, full-color picture is assembled.

Colorants that are used in the printing industry are insoluble pigments. By virtue of their pigment character, the spectrophotometric curves of the printing inks are often unusually sharp on either the bathochromic or hypsochromic side. This can cause problems in color proofing systems in which dyes, as opposed to pigments, are being used. It is very difficult to match the hue of a given ink using a single dye.

In U.S. Pat. No. 5,126,760, a process is described for producing a direct digital, halftone color proof of an original image on a dye-receiving element. The proof can then be used to represent a printed color image obtained from a printing press. The process described therein comprises:

a) generating a set of electrical signals which is representative of the shape and color scale of an original image;

b) contacting a dye-donor element comprising a support having thereon a dye layer and an infrared-absorbing material with a first dye-receiving element comprising a support having thereon a polymeric, dye image-receiving layer;

c) using the signals to imagewise-heat by means of a diode laser the dye-donor element, thereby transferring a dye image to the first dye-receiving element; and d) retransferring the dye image to a second dye image-receiving element which has the same substrate as the printed color image. In the above process, multiple dye-donors are used to obtain a complete range of colors in the proof. For example, for a full-color proof, four colors: cyan, magenta, yellow and black are normally used.

By using the above process, the image dye is transferred by heating the dye-donor containing the infrared-absorbing material with the diode laser to volatilize the dye, the diode laser beam being modulated by the set of signals which is representative of the shape and color of the original image, so that the dye is heated to cause volatilization only in those areas in which its presence is required on the dye-receiving layer to reconstruct the original image.

Similarly, a thermal transfer proof can be generated by using a thermal head in place of a diode laser as described in U.S. Pat. No. 4,923,846. Commonly available thermal heads are not capable of generating halftone images of adequate resolution but can produce high quality continuous tone proof images which are satisfactory in many instances. U.S. Pat. No. 4,923,846 also discloses the choice of mixtures of dyes for use in thermal imaging proofing systems. The dyes are selected on the basis of values for hue error and turbidity. The Graphic Arts Technical Foundation Research Report No. 38, "Color Material" (58-(5) 293–301, 1985) gives an account of this method.

An alternative and more precise method for color measurement and analysis uses the concept of uniform color space known as CIELAB in which a sample is analyzed mathematically in terms of its spectrophotometric curve, the nature of the illuminant under which it is viewed and the color vision of a standard observer. For a discussion of CIELAB and color measurement, see *Principles of Color Technology*, 2nd Edition, F. W. Billmeyer, p. 25–110, Wiley-Interscience and *Optical Radiation Measurements*, Volume 2, F. Grum, p. 33–145, Academic Press.

In using CIELAB, colors can be expressed in terms of three parameters: $L^*$, $a^*$ and $b^*$, where $L^*$ is a lightness function, and $a^*$ and $b^*$ define a point in color space. Thus, a plot of $a^*$ vs $b^*$ values for a color sample can be used to accurately show where that sample lies in color space, i.e., what its hue is. This allows different samples to be compared for hue if they have similar density and $L^*$ values.

In color proofing in the printing industry, it is important to be able to match the proofing ink references provided by the International Prepress Proofing Association. These ink references are density patches made with standard 4-color process inks and are known as SWOP® (Specifications Web Offset Publications) color aims. For additional information on color measurement of inks for web offset proofing, see "Advances in Printing Science and Technology", Proceedings of the 19th International Conference of Printing Research Institutes, Eisenstadt, Austria, June 1987, J. T. Ling and R. Warner, p.55.

The magenta SWOP color aim is actually slightly reddish since it contains a high amount of blue absorption. Therefore, a "good" magenta dye selected from a photographic standpoint would not be suitable for matching the magenta SWOP color aim.

DESCRIPTION OF RELATED ART

In U.S. Pat. No. 5,023,229, a mixture of a magenta dye and a yellow dye is described for color proofing. However, there may be a problem with using this mixture in that an acceptable gray balance is not obtained when overprinted sequentially with certain yellow and cyan thermal transfer dyes. There is another problem with using that mixture in color proofs for Japan and Europe in that the colorimetry is not as good as one would desire.

It is an object of this invention to provide a mixture of magenta dyes for color proofing wherein an acceptable gray balance is obtained when printed sequentially with yellow and cyan thermal transfer dyes. It is another object of this invention to provide a mixture of magenta dyes for color proofing wherein the colorimetry is improved.

SUMMARY OF THE INVENTION

These and other objects are obtained by this invention which relates to a magenta dye-donor element for thermal dye transfer comprising a support having thereon a dye layer comprising a mixture of magenta dyes dispersed in a polymeric binder, at least one of the magenta dyes having the formula:

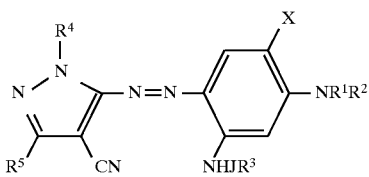

wherein:

- $R^1$ is a substituted or unsubstituted alkyl or allyl group of from 1 to about 6 carbon atoms, such as methyl, ethyl, propyl, isopropyl, butyl, pentyl, allyl, but-2-en-1-yl, 1,1-dichloropropen-3-yl, or such alkyl or allyl groups substituted with hydroxy, acyloxy, alkoxy, aryl, cyano, acylamido, halogen, etc.;
- X is an alkoxy group of from 1 to about 4 carbon atoms or represents the atoms which when taken together with $R^2$ forms a 5- or 6-membered ring;
- $R^2$ is any of the groups for $R^1$ or represents the atoms which when taken together with X forms a 5- or 6-membered ring;
- $R^3$ is a substituted or unsubstituted alkyl group of from 1 to about 6 carbon atoms such as those listed above for $R^1$, or a substituted or unsubstituted aryl group of from about 6 to about 10 carbon atoms such as phenyl, naphthyl, p-tolyl, m-chlorophenyl, p-methoxyphenyl, m-bromophenyl, o-tolyl, etc.;
- J is CO, $CO_2$, —$SO_2$— or $CONR^5$—;
- $R^4$ is a substituted or unsubstituted alkyl or allyl group of from 1 to about 6 carbon atoms, such as those listed above for $R^1$, or a substituted or unsubstituted aryl group of from about 6 to about 10 carbon atoms, such as those listed above for $R^3$; and
- $R^5$ is hydrogen, a substituted or unsubstituted alkyl group of from 1 to about 6 carbon atoms, such as those listed above for $R^1$, or a substituted or unsubstituted aryl group of from about 6 to about 10 carbon atoms, such as those listed above for $R^3$; and at least another of the magenta dyes having the formula:

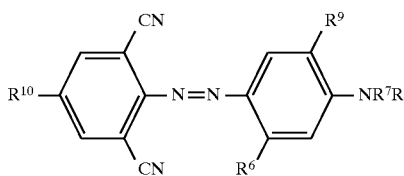

wherein:

- $R^6$ is a substituted or unsubstituted alkyl group having from 1 to about 4 carbon atoms, an alkoxy group having from 1 to about 4 carbon atoms, an alkylcarbonamido group having from 1 to about 6 carbon atoms or an alkylsulfonamido group having from 1 to about 8 carbon atoms;
- $R^7$ and $R^8$ each individually represent a substituted or unsubstituted aryl group having from about 6 to about 10 carbon atoms, a substituted or unsubstituted alkyl group having from 1 to about 5 carbon atoms, an alkoxyalkyl group having from 3 to about 8 carbon atoms, an aralkyl group having from about 7 to about 10 carbon atoms or a hydroxyalkyl group having from about 2 to about 5 carbon atoms;
- $R^9$ is hydrogen, halogen, an alkoxy group having from 1 to about 4 carbon atoms or may be taken together with $R^7$ or $R^8$ to form a 5-or 6-membered heterocyclic ring; and
- $R^{10}$ is hydrogen, a substituted or unsubstituted alkyl group having from 1 to about 8 carbon atoms or an alkoxy group having from 1 to about 4 carbon atoms.

In a preferred embodiment of the invention, $R^1$ and $R^2$ in the above formula I are each ethyl, X is $OCH_3$, J is CO, $R^3$ and $R^4$ are each $CH_3$, and $R^5$ is $C_4H_9$-t In another preferred embodiment of the invention, $R^1$ and $R^2$ are each ethyl, X is $OCH_3$, J is CO, $R^3$ is $CH_3$, $R^4$ is $CH_2CHOHCH_3$, and $R^5$ is $C_4H_9$-t.

In another preferred embodiment of the invention, $R^6$ in the above formula II is $NHCOCH_3$, $NHSO_2CH_3$ or $CH_3$ and $R^7$ is $C_2H_5$, $C_3H_7$ or $CH_2CH_2OH$. In still another preferred embodiment of the invention, $R^8$ in the above formula II is $C_2H_5$ or $C_3H_7$ and $R^{10}$ is $CH_3$ or $OCH_3$.

The compounds of the above formula I employed in the invention may be prepared by any of the processes disclosed in U.S. Pat. No. 3,336,285, Br 1,566,985, DE 2,600,036 and Dyes and Pigments, Vol 3, 81 (1982), the disclosures of which are hereby incorporated by reference.

The compounds in the above formula II employed in the invention are more fully disclosed along with their preparation in U.S. Pat. No. 5,234,887, the disclosure of which is hereby incorporated by reference.

Magenta dyes included within the scope of the above formula I include the following:

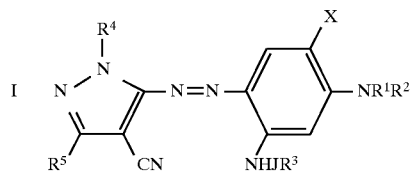

| Dye | $R^1$ | $R^2$ | $R^3$ | $R^4$ | $R^5$ | X | J |
|---|---|---|---|---|---|---|---|
| 1 | $C_2H_5$ | $C_2H_5$ | $CH_3$ | $CH_3$ | $C_4H_9$-t | $OCH_3$ | CO |
| 2 | $C_2H_5$ | $C_2H_5$ | $CH_3$ | $CH_2CHOHCH_3$ | $C_4H_9$-t | $OCH_3$ | CO |
| 3 | $C_2H_5$ | $C_2H_5$ | $CH_3$ | $CH_2CHOHC_6H_5$ | $C_4H_9$-t | $OCH_3$ | CO |
| 4 | $C_2H_5$ | $C_2H_5$ | $C_4H_9$-t | $CH_3$ | $CH_3$ | $OCH_3$ | CO |

-continued

Structure I:
Pyrazole with R⁴ on N, R⁵ at position, CN substituent, N=N azo link to benzene ring with X, NR¹R², and NHJR³ substituents.

| Dye | R¹ | R² | R³ | R⁴ | R⁵ | X | J |
|---|---|---|---|---|---|---|---|
| 5 | $C_2H_5$ | $C_2H_5$ | $CH_3$ | $C_2H_5$ | $C_4H_9$-t | $OC_2H_5$ | $SO_2$ |
| 6 | $C_2H_5$ | $C_2H_5$ | $C_2H_5$ | $CH_3$ | $CH_3$ | $OC_2H_5$ | $CO$ |
| 7 | $C_2H_5$ | $C_3H_7$ | $CH_3$ | $CH_3$ | $C_4H_9$-t | $OCH_3$ | $CO$ |
| 8 | $C_2H_5$ | $C_2H_5$ | $CH_3$ | $CH_3$ | $C_4H_9$- | $OCH_3$ | $CO_2$ |
| 9 | $C_2H_5$ | $C_2H_5$ | $C_6H_5$ | $C_3H_7$ | $C_4H_9$-t | $OC_2H_5$ | $SO_2$ |
| 10 | $CH_2=CHCH_2$ | $CH_2=CHCH_2$ | $CH_3$ | $CH_2C_6H_5$ | $C_4H_9$-t | $OCH_3$ | $CO$ |
| 11 | $C_3H_7$ | $C_3H_7$ | $C_2H_5$ | $C_2H_5$ | $CH_3$ | $OC_3H_7$ | $CO$ |
| 12 | $C_3H_7$ | $C_3H_7$ | $C_2H_5$ | $C_2H_5$ | $CH_3$ | $OC_3H_7$ | $SO_2$ |

13: Pyrazole (N-$CH_3$, $C_4H_9$-t, CN) — N=N — benzene (NHCOCH₃, morpholine-type ring with O and N-$C_2H_5$)

14: Pyrazole ($C_2H_5$ on N, $CH_3$, CN) — N=N — benzene (NHCOCH₃) fused with tetrahydroquinoline bearing $CH_3$ groups and N-$CH_3$ Magenta dyes included within the scope of the above formula II include the following:

Structure II: $R^{10}$-substituted benzene with two CN groups and $R^6$, connected by N=N to another benzene with $R^9$ and $NR^7R^8$.

| Compound No | R⁶ | R⁷ | R⁸ | R⁹ | R¹⁰ |
|---|---|---|---|---|---|
| A | $NHCOCH_3$ | $C_2H_5$ | $C_2H_5$ | H | $CH_3$ |
| B | $NHSO_2CH_3$ | $C_2H_5$ | $C_3H_7$ | H | $OCH_3$ |
| C | $CH_3$ | $C_2H_5$ | $C_3H_7$ | H | $OCH_3$ |
| D | $NHSO_2CH_3$ | $C_3H_7$ | $C_3H_7$ | H | $CH_3$ |
| B | $NHSO_2CH_3$ | $C_2H_5$ | $C_2H_5$ | H | $CH_3$ |
| F | $NHCOCH_3$ | $CH_2CH_2OH$ | $C_3H_7$ | H | $OCH_3$ |

In another preferred embodiment of the invention, a yellow dye may also be included with the magenta dye mixture in order to increase the amount of blue absorption and to adjust the colorimetry to match the magenta SWOP color aim.

A suitable yellow dye which may be employed with the magenta dyes disclosed above has the following formula:

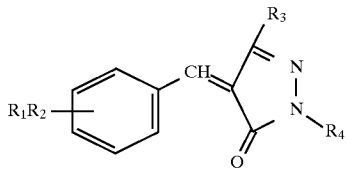

wherein:

$R_1$, $R_2$ and $R_3$ each individually represents hydrogen or a substituted or unsubstituted alkyl or alkoxy group having from 1 to about 4 carbon atoms; and $R_4$ represents a substituted or unsubstituted aryl group having from 6 to about 10 carbon atoms or a substituted or unsubstituted alkyl group having from 1 to about 4 carbon atoms.

In a preferred embodiment, yellow dyes according to the above formula have the following structures:

| Compound No | R₁ | R₂ | R₃ | R₄ |
|---|---|---|---|---|
| Y1 | 3-$CH_3O$ | 4-$CH_3O$ | $CH_3$ | $C_6H_5$ |
| Y2 | 3-$CH_3O$ | H | $CH_3$ | $C_6H_5$ |
| Y3 | H | 4-$CH_3O$ | $CH_3$ | $C_6H_5$ |
| Y4 | 3-$CH_3$ | 4-$CH_3O$ | $CH_3$ | $C_6H_5$ |
| Y5 | 3-$CH_3$ | 4-$CH_3$ | $CH_3$ | $C_6H_5$ |
| Y6 | 3-$CH_3$ | 4-$CH_3$ | $CH_3O$ | $CH_3$ |
| Y7 | 3-$CH_3$ | 4-$CH_3$ | $CH_3O$ | $C_6H_5$ |
| Y8 | H | 4-$CH_3O$ | $CH_3O$ | $C_2H_5$ |

The use of dye mixtures in the dye-donor of the invention permits a wide selection of hue and color that enables a closer hue match to a variety of printing inks to be achieved and also permits easy transfer of images to a receiver one or more times if desired. The use of dyes also allows easy modification of image density to any desired level. The dyes of the dye-donor element of the invention may be used at a coverage of from about 0.02 to about 1 g/m$^2$.

The dyes in the dye-donor of the invention are dispersed in a polymeric binder such as a cellulose derivative, e.g., cellulose acetate hydrogen phthalate, cellulose acetate, cellulose acetate propionate, cellulose acetate butyrate, cellulose triacetate or any of the materials described in U.S. Pat. No. 4,700,207; a polycarbonate; poly(vinyl acetate); poly (styrene-co-acrylonitrile); a polysulfone or a poly(phenylene oxide). The binder may be used at a coverage of from about 0.1 to about 5 g/m$^2$.

The dye layer of the dye-donor element may be coated on the support or printed thereon by a printing technique such as a gravure process.

Any material can be used as the support for the dye-donor element of the invention provided it is dimensionally stable and can withstand the heat of the laser or thermal head. Such materials include polyesters such as poly(ethylene terephthalate); polyamides; polycarbonates; cellulose esters such as cellulose acetate; fluorine polymers such as poly (vinylidene fluoride) or poly(tetrafluoroethylene-co-hexafluoropropylene); polyethers such as polyoxymethylene; polyacetals; polyolefins such as polystyrene, polyethylene, polypropylene or methylpentene polymers; and polyimides such as polyimide-amides and polyether-imides. The support generally has a thickness of from about 5 to about 200 μm. It may also be coated with a subbing layer, if desired, such as those materials described in U.S. Pat. Nos. 4,695,288 or 4,737,486.

The reverse side of the dye-donor element may be coated with a slipping layer to prevent the printing head from sticking to the dye-donor element.

Such a slipping layer would comprise either a solid or liquid lubricating material or mixtures thereof, with or without a polymeric binder or a surface-active agent. Preferred lubricating materials include oils or semicrystalline organic solids that melt below 100° C. such as poly(vinyl stearate), beeswax, perfluorinated alkyl ester polyethers, polycaprolactone, silicone oil, polytetrafluoroethylene, carbowax, poly(ethylene glycols), or any of those materials disclosed in U.S. Pat. Nos. 4,717,711; 4,717,712; 4,737,485; and 4,738,950. Suitable polymeric binders for the slipping layer include poly(vinyl alcohol-co-butyral), poly(vinyl alcohol-co-acetal), polystyrene, poly(vinyl acetate), cellulose acetate butyrate, cellulose acetate propionate, cellulose acetate or ethyl cellulose.

The amount of the lubricating material to be used in the slipping layer depends largely on the type of lubricating material, but is generally in the range of about 0.001 to about 2 g/m$^2$. If a polymeric binder is employed, the lubricating material is present in the range of 0.1 to 50 weight %, preferably 0.5 to 40%, of the polymeric binder employed.

The dye-receiving element that is used with the dye-donor element of the invention usually comprises a support having thereon a dye image-receiving layer. The support may be a transparent film such as a poly(ether sulfone), a polyimide, a cellulose ester such as cellulose acetate, a poly(vinyl alcohol-co-acetal) or a poly(ethylene terephthalate). The support for the dye-receiving element may also be reflective such as baryta-coated paper, polyethylene-coated paper, an ivory paper, a condenser paper or a synthetic paper such as DuPont Tyvek®. Pigmented supports such as white polyester (transparent polyester with white pigment incorporated therein) may also be used.

The dye image-receiving layer may comprise, for example, a polycarbonate, a polyurethane, a polyester, poly (vinyl chloride), poly(styrene-co-acrylonitrile), polycaprolactone, a poly(vinyl acetal) such as poly(vinyl alcohol-co-butyral), poly(vinyl alcohol-co-benzal), poly (vinyl alcohol-co-acetal) or mixtures thereof. The dye image-receiving layer may be present in any amount which is effective for the intended purpose. In general, good results have been obtained at a concentration of from about 1 to about 5 g/m$^2$.

As noted above, the dye-donor elements of the invention are used to form a dye transfer image. Such a process comprises imagewise-heating a dye-donor element as described above and transferring a dye image to a dye-receiving element to form the dye transfer image.

The dye-donor element of the invention may be used in sheet form or in a continuous roll or ribbon. If a continuous roll or ribbon is employed, it may have only the dyes thereon as described above or may have alternating areas of other different dyes or combinations, such as sublimable cyan and/or yellow and/or black or other dyes. Such dyes are disclosed in U.S. Pat. No. 4,541,830, the disclosure of which is hereby incorporated by reference. Thus, one-, two-, three- or four-color elements (or higher numbers also) are included within the scope of the invention.

Thermal printing heads which can be used to transfer dye from the dye-donor elements of the invention are available commercially. There can be employed, for example, a Fujitsu Thermal Head (FIP-040 MCSOO1), a TDK Thermal Head F415 HH7-1089 or a Rohm Thermal Head KE 2008-F3.

A laser may also be used to transfer dye from the dye-donor elements of the invention. When a laser is used, it is preferred to use a diode laser since it offers substantial advantages in terms of its small size, low cost, stability, reliability, ruggedness, and ease of modulation. In practice, before any laser can be used to heat a dye-donor element, the element must contain an absorbing material which absorbs at the emitting wavelength of the laser. When an infrared laser is employed, then an infrared-absorbing material may be used, such as carbon black, cyanine infrared-absorbing dyes as described in U.S. Pat. No. 4,973,572, or other materials as described in the following U.S. Pat. Nos.: 4,948,777; 4,950,640; 4,950,639; 4,948,776; 4,948,778; 4,942,141; 4,952,552; 5,036,040; and 4,912,083, the disclosures of which are hereby incorporated by reference. The laser radiation is then absorbed into the dye layer and converted to heat by a molecular process known as internal conversion. Thus, the construction of a useful dye layer will depend not only on the hue, transferability and intensity of the image dyes, but also on the ability of the dye layer to absorb the radiation and convert it to heat.

Lasers which can be used to transfer dye from dye-donors employed in the invention are available commercially. There can be employed, for example, Laser Model SDL-2420-H2 from Spectra Diode Labs, or Laser Model SLD 304 V/W from Sony Corp.

A thermal printer which uses the laser described above to form an image on a thermal print medium is described and claimed in U.S. Pat. No. 5,268,708, the disclosure of which is hereby incorporated by reference.

Spacer beads may be employed in a separate layer over the dye layer of the dye-donor in the above-described laser process in order to separate the dye-donor from the dye-receiver during dye transfer, thereby increasing the uniformity and density of the transferred image. That invention is more fully described in U.S. Pat. No. 4,772,582, the disclosure of which is hereby incorporated by reference. Alternatively, the spacer beads may be employed in the receiving layer of the dye-receiver as described in U.S. Pat. No. 4,876,235, the disclosure of which is hereby incorporated by reference. The spacer beads may be coated with a polymeric binder if desired.

The use of an intermediate receiver with subsequent retransfer to a second receiving element may also be employed in the invention. A multitude of different substrates can be used to prepare the color proof (the second receiver) which is preferably the same substrate as that used for the printing press run. Thus, this one intermediate receiver can be optimized for efficient dye uptake without dye-smearing or crystallization.

Examples of substrates which may be used for the second receiving element (color proof) include the following: Flo Kote Cover® (S. D. Warren Co.), Champion Textweb® (Champion Paper Co.), Quintessence Gloss® (Potlatch Inc.), Vintage Gloss® (Potlatch Inc.), Khrome Kote® (Champion Paper Co.), Consolith Gloss® (Consolidated Papers Co.), Ad-Proof Paper® (Appleton Papers, Inc.) and Mountie Matte® (Potlatch Inc.).

As noted above, after the dye image is obtained on a first dye-receiving element, it may be retransferred to a second dye image-receiving element. This can be accomplished, for example, by passing the two receivers between a pair of heated rollers. Other methods of retransferring the dye image could also be used such as using a heated platen, use of pressure and heat, external heating, etc.

Also as noted above, in making a color proof, a set of electrical signals is generated which is representative of the shape and color of an original image. This can be done, for example, by scanning an original image, filtering the image to separate it into the desired additive primary colors, i.e., red, blue and green, and then converting the light energy into electrical energy. The electrical signals are then modified by computer to form the color separation data which are used to form a halftone color proof. Instead of scanning an original object to obtain the electrical signals, the signals may also be generated by computer. This process is described more fully in *Graphic Arts Manual*, Janet Field ed., Arno Press, New York 1980 (p. 358ff), the disclosure of which is hereby incorporated by reference.

A thermal dye transfer assemblage of the invention comprises a) a dye-donor element as described above, and b) a dye-receiving element as described above, the dye-receiving element being in a superposed relationship with the dye-donor element so that the dye layer of the donor element is in contact with the dye image-receiving layer of the receiving element.

The above assemblage comprising these two elements may be preassembled as an integral unit when a monochrome image is to be obtained. This may be done by temporarily adhering the two elements together at their margins. After transfer, the dye-receiving element is then peeled apart to reveal the dye transfer image.

When a three-color image is to be obtained, the above assemblage is formed three times using different dye-donor elements. After the first dye is transferred, the elements are peeled apart. A second dye-donor element (or another area of the donor element with a different dye area) is then brought in register with the dye-receiving element and the process repeated. The third color is obtained in the same manner. The following examples are provided to illustrate the invention.

EXAMPLES

Example 1

Magenta individual dye-donor elements were prepared by coating on a 100 μm poly(ethylene terephthalate) support a dye layer containing a mixture of the magenta dyes identified above, the cyanine infrared-absorbing dye disclosed in U.S. Pat. No. 5,024,990 (column 13 lines 1–15) at 0.054 g/m$^2$ in a cellulose acetate propionate binder (CAP 482-20 from Eastman Chemical Company) at 0.54 g/m$^2$. The following experimental ratios shown in Table 1 were used in laydowns as listed:

TABLE 1

| Magenta Dye-Donor | Magenta Dye (wt. %) | Magenta Dye (wt. %) | Yellow Dye (wt. %) | Dry Coverage (g/m$^2$) |
|---|---|---|---|---|
| Em-1  | 2 (54.5) | D (27.2)       | Y-1 (18.2) | 0.473 |
| Em-2  | 2 (56.9) | D (25.9)       | Y-1 (17.2) | 0.495 |
| Em-3  | 2 (51.9) | D (28.8)       | Y-1 (19.2) | 0.452 |
| Em-4  | 2 (53.1) | D (29.2)       | Y-1 (17.7) | 0.484 |
| Em-5  | 2 (56.1) | D (25.2)       | Y-1 (18.7) | 0.463 |
| Em-6  | 2 (56.6) | D (28.3)       | Y-1 (15.1) | 0.452 |
| Em-7  | 2 (53.5) | D (32.7)       | Y-1 (13.9) | 0.430 |
| Em-8  | 2 (45.5) | D (36.3)       | Y-1 (18.2) | 0.473 |
| Em-9  | 2 (55.1) | D (30.6)       | Y-1 (14.3) | 0.420 |
| Em-10 | 3 (56.8) | D (30.3)       | Y-1 (12.8) | 0.517 |
| Em-11 | 3 (56.8) | D (29.1)       | Y-1 (12.3) | 0.538 |
| Em-12 | 2 (54.0) | D (30.0)       | Y-1 (16.0) | 0.430 |
| Em-13 | 2 (57.7) | D (28.8)       | Y-1 (13.5) | 0.452 |
| Em-14 | 2 (53.5) | E (32.7)       | Y-1 (13.9) | 0.430 |
| Em-15 | 2 (53.5) | D (16) E (16)  | Y-1 (13.9) | 0.430 |
| Em-16 | 2 (57.5) | D (35.2)       | Y-1 (7.3)  | 0.441 |
| Em-17 | 2 (62.0) | D (38.0)       |            | 0.409 |
| Em-18 | 2 (53.5) | D (38.5)       | Y-1 (8.0)  | 0.398 |
| Em-19 | 2 (58.1) | D (41.1)       |            | 0.366 |

Control-1 for comparative purposes was Kodak APPROVAL® Magenta Digital Color Proofing Film, CAT # 803 0314.

An intermediate dye-receiving element, Kodak APPROVAL® Intermediate Color Proofing Film, CAT # 831 5582, was used with the above dye-donor elements to print an image. For the monochrome magenta images, the power to the laser array was modulated to produce a continuous tone image consisting of uniform "steps" of varying density as described in U.S. Pat. No. 4,876,235. After the laser array had finished scanning the image area, the laser exposure device was stopped and the intermediate receiver containing the transferred image was laminated to Textweb® (Champion Papers, Inc.) 60# paper stock which had been previously laminated with Kodak APPROVAL® Prelaminate, CAT # 173 9671.

All measurements were made using a Gretag SPM100 portable spectrophotometer set for D$_{50}$ illuminant and 2° observer angle. Readings were made with black backing behind the samples. The CIELAB L* a* b* coordinates reported are interpolated to a Status T density of 1.40.

The color differences between the samples can be expressed as ΔE where ΔE is the vector difference in CIELAB color space between the laser thermal generated image and the SWOP aim.

ΔE=square root ( $(L^*_e-L^*s)^2+(a^*_e-a^*_s)^2+(b^*_e-b^*_s)^2$ )

Hue angle=360 −arc tan b*/a* for negative b*

=arc tan b*/a* for positive b*

C*=square root $(a^{*2}+b^{*2})$ wherein subscript e represents the measurements from the experimental material and subscript s represents the measurements from the SWOP standard color aim.

Table 2 summarizes the results obtained. The SWOP standard was taken from the Committee for Graphic Arts Technology Standards publication ANSI CGATS.6-1995.

TABLE 2

| Magenta Dye-Donor | L* | a* | b* | ΔE | Hue Angle | ΔHue Angle | C* | ΔC* |
|---|---|---|---|---|---|---|---|---|
| SWOP | 46.2 | 70.0 | −1.5 | — | 358.8 | — | 70.0 | — |
| Control-1 | 47.4 | 69.6 | 0.6 | 2.5 | 0.5 | 1.7 | 69.6 | −0.4 |
| Em-1 | 48.6 | 70.6 | −1.2 | 2.6 | 359.0 | 0.2 | 70.6 | 0.6 |
| Em-2 | 48.6 | 70.9 | −1.9 | 2.6 | 358.5 | −0.3 | 70.9 | 0.9 |
| Em-3 | 48.5 | 69.9 | 0.4 | 3.0 | 0.3 | 1.5 | 69.9 | −0.1 |
| Em-4 | 48.8 | 70.8 | −0.7 | 2.8 | 359.4 | 0.6 | 70.8 | 0.8 |
| Em-5 | 48.5 | 70.5 | −1.1 | 2.4 | 359.1 | 0.3 | 70.5 | 0.5 |
| Em-6 | 48.5 | 70.6 | −2.0 | 2.5 | 358.4 | −0.4 | 70.9 | 0.6 |
| Em-7 | 48.7 | 70.9 | −2.0 | 2.5 | 358.4 | −0.4 | 70.9 | 0.9 |
| Em-8 | 49.1 | 71.1 | 1.1 | 3.0 | 0.9 | 2.1 | 71.1 | 1.1 |
| Em-9 | 48.9 | 71.3 | −1.8 | 3.0 | 358.6 | −0.2 | 71.3 | 1.3 |
| Em-10 | 49.0 | 70.7 | −0.3 | 3.1 | 359.8 | 1.0 | 70.7 | 0.7 |
| Em-11 | 48.9 | 70.7 | −0.9 | 2.9 | 359.3 | 0.5 | 70.7 | 0.7 |
| Em-12 | 48.9 | 70.9 | −1.4 | 2.8 | 358.9 | 0.1 | 70.9 | 0.9 |
| Em-13 | 48.7 | 71.0 | −2.6 | 2.9 | 357.9 | −0.9 | 71.0 | 1.0 |
| Em-14 | 48.1 | 70.0 | −1.9 | 1.9 | 358.4 | −0.4 | 70.0 | 0.0 |
| Em-15 | 49.0 | 70.7 | −0.7 | 3.0 | 359.4 | 0.6 | 70.7 | 0.7 |
| Em-20 | 48.7 | 70.6 | 0.8 | 3.4 | 0.6 | 1.8 | 70.6 | 0.6 |

The above results show that the hue angle of the magenta combinations of the invention can be adjusted to be similar to the Control 1 or can be adjusted to be similar to the SWOP® aim while maintaining saturation.

Example 2

It is desirable to provide proofs which can be used in parts of the world which do not use the SWOP aims. For example, in Japan, a different standard is used and it would be desirable to provide a closer match to Japan Color.

Magenta dye-donors Em- 6-19, Em-13 and Control-1 described above were printed as above and then laminated to Mitsubishi Tokyo Art paper. The Japan Color/Color Sample colorimetry values published by the Japan National Committee for ISO/TC130 were used as the color reference. The CIELAB L* a* b* coordinates reported are interpolated to a Status T density of 1.50. The data are summarized in the following Table 3:

TABLE 3

| Magenta Dye-Donor | L* | a* | b* | ΔE | Hue Angle | ΔHue Angle | C* | ΔC* |
|---|---|---|---|---|---|---|---|---|
| Japan Color | 46.4 | 74.4 | −4.8 | — | 356.3 | — | 74.4 | — |
| Control-1 | 47.0 | 72.3 | 2.4 | 7.5 | 1.9 | 5.6 | 72.3 | −2.2 |
| Em-16 | 48.7 | 75.1 | −3.8 | 2.6 | 357.1 | 0.8 | 75.2 | 0.7 |
| Em-17 | 48.7 | 75.5 | −6.1 | 2.9 | 355.4 | −0.9 | 75.7 | 1.2 |
| Em-18 | 48.9 | 74.8 | −2.0 | 2.8 | 358.5 | 2.2 | 74.8 | 0.3 |
| Em-19 | 48.5 | 75.3 | −4.9 | 2.3 | 356.3 | 0.0 | 75.5 | 1.0 |
| Em-13 | 48.5 | 74.5 | −2.4 | 2.4 | 358.2 | 1.9 | 74.5 | 0.0 |

The above data show that the magenta combinations of the invention provide a much closer match to Japan Color than does Control-1, particularly in the small hue angle error (Δ Hue Angle) and in ΔE.

Example 3

In Europe, ISO 12647-2: 1996(E) specifies standards for proofing and production printing on various paper substrates. Paper Type 3 from Table 1 of ISO 12647-2:1996(E) closely matches Champion Textweb®. Table 3 from ISO 12647-2:1996(E) specifies CIELAB coordinates for the color primaries. Magenta dye-donors Em-1, Em-6, Em-7, Em-9, Em-18 and Control-1 described above were printed as above and then laminated to Champion Textweb® paper. The CIELAB L* a* b* coordinates reported are interpolated to a Status T density of 1.45. The data are summarized in the following Table 4:

TABLE 4

| Magenta Dye-Donor | L* | a* | b* | ΔE | Hue Angle | ΔHue Angle | C* | ΔC* |
|---|---|---|---|---|---|---|---|---|
| ISO 12647-2 | 45 | 71 | −2 | — | 358.4 | — | 71.0 | — |
| Control-1 | 46.6 | 70.5 | 1.9 | 4.2 | 1.5 | 3.1 | 70.5 | −0.5 |
| Em-1 | 48.5 | 70.6 | −1.1 | 3.6 | 359.1 | 0.7 | 70.6 | −0.4 |
| Em-6 | 47.9 | 71.4 | −1.4 | 3.0 | 358.9 | 0.5 | 71.4 | 0.4 |
| Em-7 | 48.7 | 71.0 | −2.0 | 3.7 | 358.4 | 0.0 | 71.0 | 0.0 |
| Em-9 | 48.9 | 71.1 | −1.8 | 3.9 | 358.5 | 0.1 | 71.1 | 0.1 |
| Em-18 | 48.5 | 72.3 | −2.1 | 3.7 | 358.3 | 0.1 | 72.3 | 1.3 |

The above data show that the magenta dye-donor of the invention printed on Champion Textweb® provides a good match to the color coordinate specifications for the ISO 12647-2, particularly in the small hue angle error (Δ Hue Angle).

Example 4

Gray Scale Overprint

This example uses the magenta dye combination of the invention along with cyan dye combination described in copending application Ser. No. 08/920,972, of Chapman et al. (Docket 76,268), filed of even date herewith, copending application Ser. NO. 08/919,557, of Chapman et al. (Docket 76,269), filed of even date herewith, and copending application Ser. No. 08/920,973, of Chapman et al. (Docket 76,270), filed of even date herewith to provide a gray scale overprint., Three-color overprint images were then prepared by sequentially imaging various combinations of the cyan, magenta and yellow dye-donors described above in register onto the same intermediate receiver layer. In this case, the laser array was modulated to produce stepped half-tone images of varying density, by printing dot patterns of varying dot size (area coverage).

Proofs were generated using the set-up conditions described in the SWOP Off-Press Proof Application Data Sheet for the KODAK APPROVAL Digital Color Proofing System (Kodak Publication # PG-830). This data sheet provides guidance on how users are to set up their Approval Systems to emulate press proofing and production printing done SWOP® specifications. Except for the darker, less saturated cyan the results of this set -up, when proofed with existing product, are accepted by the industry as a faithful representation of such proofing and printing. Any newly introduced donor should not greatly change the overall color results, particularly gray balance, at this set-up.

The cyan dye mixtures Ec-1 through Ec-6 were combinations of variations of structures B and K (see below) as disclosed in copending application Ser. No. 08/919,557. of Chapman et al. (Docket 76,269), filed of even date herewith

TABLE 5

B

| Compound | R | $R_1$ | $R_2$ |
|---|---|---|---|
| B-1 | H | $C_4H_9$ | $C_4H_9$ |
| B-2 | $CH_3$ | $C_2H_5$ | $C_2H_5$ |
| B-3 | $CH_3$ | $CH_3OCH_2CH_2-$ | $C_2H_5$ |
| B-4 | $CH_3$ | $CH_3(C_2H_5)CH-$ | $C_2H_5$ |
| B-5 | $CH_3$ | $C_4H_9$ | $C_2H_5$ |

TABLE 6

K

| Compd. | $R^3$ | Y | X | J |
|---|---|---|---|---|
| K-1 | H | $-(CH=CH)_2-$ | | $CONHCH_3$ |
| K-2 | 3-$CH_3$ | $C_2H_5$ | Cl | $NHCO$-i-$C_3H_7$ |
| K-3 | 3-$CH_3$ | $NHCOCH_3$ | H | $NHCOC_3F_7$ |

The cyan dye mixtures Ec-7, Ec-8 and Ec-9 were mixtures of dyes of structure B above with dyes such as structure C below as disclosed in copending application Ser. No. 08/920,972; of Chapman et al. (Docket 76,268), filed of even date herewith.

TABLE 7

C

| Dye # | $R_1$ | $R_2$ | $R_3$ | $R_4$ |
|---|---|---|---|---|
| C-A | $C_2H_5$ | $C_2H_5$ | $C_6H_5CO-$ | m-$CH_3$ |
| C-B | $(CH_3)_2\underset{\|}{C}-\underset{\|}{CH_2CHCH_3}$ | $C_4H_9$ | $CH_2=CHCH_2-$ | H |
| C-C | $(CH_3)_2\underset{\|}{C}=\underset{\|}{CHCHCH_3}$ | $C_2H_5$ | $CH_3$ | H |
| C-D | $C_4H_9$ | $C_4H_9$ | $C_4H_9$ | m-$CH_3$ |
| C-E | $(CH_3)_2\underset{\|}{C}-\underset{\|}{CH_2CHCH_3}$ | $C_4H_9$ | $CH_2=CHCH_2-$ | m-$CH_3$ |
| C-F | $C_4H_9$ | $C_4H_9$ | $C_2H_5CO-$ | H |

The cyan dye mixtures Ec-10 and Ec-1 were derived from structure C above and dyes of structure D below described in U.S. Pat. No. 5,024,990.

TABLE 8

D

| Compound | $R_1$ | $R_2$ | $R_3$ | $R_5$ |
|---|---|---|---|---|
| D-1 | $C_2H_5$ | $C_2H_5$ | $CH_3$ | $C_6H_5$ |
| D-2 | $C_4H_9$ | $C_4H_9$ | H | $C_6H_5$ |
| D-3 | $C_2H_4OH$ | $C_2H_5$ | $CH_3$ | $C_6H_5$ |
| D-4 | $C_2H_5$ | $C_2H_5$ | $OC_2H_5$ | $C_6H_5$ |
| D-5 | $C_3H_7$ | $C_3H_7$ | $NHCOCH_3$ | $C_6H_5$ |
| D-6 | $C_2H_5$ | $C_2H_5$ | $CH_3$ | o-$C_6H_4OCH_3$ |
| D-7 | $C_2H_5$ | $C_2H_5$ | $CH_3$ | p-$C_6H_4OCH_3$ |
| D-8 | $C_2H_5$ | $C_2H_5$ | $CH_3$ | p-$C_6H_4Cl$ |
| D-9 | $C_2H_5$ | $C_2H_5$ | $CH_3$ | m-$C_6H_4NO_2$ |

Cyan individual dye-donor elements were prepared by coating on a 100 μm poly(ethylene terephthalate) support a dye layer containing a mixture of cyan dyes identified below and described above, the cyanine infrared-absorbing dye disclosed in U.S. Pat. No. 5,024,990 (column 13 lines 1–15) at 0.054 g/m² in a cellulose acetate propionate binder (CAP 482-20 from Eastman Chemical Company) at 0.54 g/m².

stopped and the intermediate receiver containing the transferred image was laminated to Textweb (Champion Papers, Inc.) 60# paper stock which had been previously laminated with Kodak APPROVAL Prelaminate, CAT # 173 9671. The colorimetry was measured on the 3-color overprints for the 100%, 75%, 50% and 25% dot patches and the results are shown in Table 10.

TABLE 10

| Overprint Element | Cyan Dye-Donor | Magenta Dye-Donor | 100% Dot | | 75% Dot | | 50% Dot | | 25% Dot | |
|---|---|---|---|---|---|---|---|---|---|---|
| | | | a* | b* | a* | b* | a* | b* | a* | b* |
| OP-1 | Control-1 | Em-control | −5.4 | −3.2 | −1.6 | 0.1 | −0.9 | −0.1 | 0.4 | 2.0 |
| OP-2 | Ec-1 | Em-control | −5.8 | −2.2 | −2.7 | 1.2 | −2.3 | 0.4 | −0.5 | 1.3 |
| OP-3 | Ec-7 | Em-control | −8.4 | −2.6 | −4.7 | −0.2 | −4.1 | −0.6 | −1.7 | 1.1 |
| OP-4 | Ec-10 | Em-control | −6.3 | −2.5 | −4.2 | 0.4 | −3.7 | −0.7 | −1.2 | 0.8 |
| OP-5 | Ec-1 | Em-1 | −2.5 | −0.8 | −1.4 | 1.1 | −1.6 | −0.1 | −0.3 | 1.6 |
| OP-6 | Ec-1 | Em-2 | −3.2 | −0.9 | −1.5 | 0.4 | −1.6 | −0.3 | 0.1 | 1.3 |
| OP-7 | Ec-1 | Em-3 | −2.5 | −0.9 | −0.6 | 1.4 | −1.2 | 0.3 | −0.1 | 1.5 |
| OP-8 | Ec-1 | Em-4 | −3.6 | −1.1 | −1.7 | 1.5 | −1.1 | 0.1 | 0.0 | 1.7 |
| OP-9 | Ec-1 | Em-5 | −3.3 | −1.2 | −1.0 | 0.4 | −1.4 | 0.2 | −0.2 | 1.5 |
| OP-10 | Ec-1 | Em-20 | −2.2 | −1.0 | −0.9 | 1.1 | −1.0 | 0.0 | −0.2 | 1.1 |
| OP-11 | Ec-1 | Em-6 | −1.2 | −1.7 | −0.3 | −0.5 | 1.4 | −1.9 | 0.8 | 1.0 |
| OP-12 | Ec-7 | Em-9 | −4.5 | −2.5 | −2.5 | −0.4 | −2.3 | −0.9 | −0.7 | 0.8 |
| OP-13 | Ec-8 | Em-9 | −3.9 | −2.2 | −1.9 | −0.8 | −2.0 | −1.3 | −0.1 | 1.0 |
| OP-14 | Ec-8 | Em-7 | −2.2 | −2.2 | −0.9 | −0.4 | −1.2 | −0.9 | −0.1 | 0.7 |
| OP-15 | Ec-9 | Em-7 | −3.5 | −2.1 | −1.9 | −0.4 | −2.1 | −0.9 | −0.6 | 0.7 |
| OP-16 | Ec-11 | Em-7 | −0.7 | −2.5 | −0.6 | −0.8 | −1.0 | −0.9 | 0.3 | 0.7 |
| OP-17 | Ec-10 | Em-7 | −1.3 | −3.1 | −0.7 | −0.4 | −0.3 | −2.1 | 0.9 | 0.4 |
| OP-18 | Ec-2 | Em-8 | −2.4 | 0.5 | −2.3 | 0.8 | −2.3 | 0.2 | −0.8 | 0.9 |
| OP-19 | Ec-1 | Em-8 | −1.4 | 2.4 | −1.0 | 3.1 | −1.6 | 1.3 | 0.2 | 2.5 |
| OP-20 | Ec-3 | Em-8 | −2.8 | 1.7 | −2.3 | 2.4 | −1.7 | 1.4 | −0.8 | 2.0 |
| OP-21 | Ec-4 | Em-8 | −2.7 | 1.5 | −1.5 | 3.0 | −1.9 | 1.2 | −0.7 | 2.2 |
| OP-22 | Ec-5 | Em-8 | −1.4 | 1.5 | −1.2 | 1.8 | −1.2 | 0.9 | −0.4 | 1.5 |
| OP-23 | Ec-6 | Em-8 | −1.9 | 1.5 | −2.1 | 1.8 | −1.8 | 0.6 | −0.5 | 1.6 |
| OP-24 | Ec-9 | Em-9 | −3.5 | −1.6 | −2.0 | −0.5 | −0.4 | 0.8 | −0.2 | 0.8 |

The following experimental ratios were used at the stated dry coverages.

TABLE 9

| Cyan Dye-Donor | Cyan Dye (wt. %) | Cyan Dye (wt. %) | Cyan Dye (wt. %) | Dry Coverage (g/m²) |
|---|---|---|---|---|
| Ec-1 | B-3 (76.5) | | K-1 (23.5) | 0.034 |
| Ec-2 | B-3 (81.3) | | K-1 (18.8) | 0.044 |
| Ec-3 | B-1 (38.2) | B-4 (38.2) | K-1 (23.5) | 0.034 |
| Ec-4 | B-1 (21.2) | B-2 (39.4) | K-1 (39.4) | 0.025 |
| Ec-5 | B-1 (15.2) | B-2 (45.5) | K-1 (39.4) | 0.033 |
| Ec-6 | B-1 (25.7) | B-2 (37.1) | K-1 (37.1) | 0.035 |
| Ec-7 | B-2 (33.3) | B-1 (17.9) | C-B (48.7) | 0.039 |
| Ec-8 | B-2 (37.1) | B-1 (20.0) | C-B (42.8) | 0.035 |
| Ec-9 | B-2 (45.4) | B-1 (15.2) | C-B (39.4) | 0.033 |
| Ec-10 | C-B (76.5) | D-8 (24.5) | | 0.035 |
| Ec-11 | C-B (82.4) | D-8 (17.6) | | 0.035 |

The magenta control (Em-control) was Kodak APPROVAL Magenta Color Proofing Film CAT # 803 0314.

The cyan control film (Control-1) for comparative purposes was Kodak APPROVAL Cyan Digital Color Proofing Film, CAT # 805 2300. The yellow donor used for the three-color overprint work is Kodak APPROVAL Yellow Digital Color Proofing Film, CAT # 194 9668.

The intermediate dye receiving element used was Kodak APPROVAL Intermediate Color Proofing Film, CAT # 831 5582. The three color overprint was printed as described in U.S. Pat. No. 4,876,435. After the laser array had finished scanning the image area, the laser exposure device was In order to have a satisfactory overprint the patches should be neutral across the dot scale and not have a greenish hue which is the case when the new cyan's are combined with the current magenta. This is shown by a* being too negative in OP-2, OP-3 and OP-4 at the various dot patches. When the new magenta formulations are used in combination with any of the cyan's, the overprints are more neutral across the dot scale, especially apparent at the 100% dot.

The invention has been described in detail with particular reference to preferred embodiments thereof, but it will be understood that variations and modifications can be effected within the spirit and scope of the invention.

What is claimed is:

1. A magenta dye-donor element for thermal dye transfer comprising a support having thereon a dye layer comprising a mixture of magenta dyes dispersed in a polymeric binder, at least one of the magenta dyes having the formula:

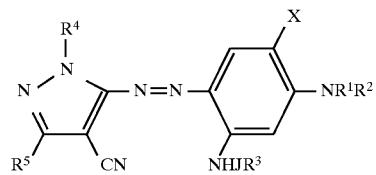

wherein:
- $R^1$ is a substituted or unsubstitated alkyl or allyl group of from 1 to about 6 carbon atoms;
- X is an alkoxy group of from 1 to about 4 carbon atoms or represents the atoms which when taken together with $R^2$ forms a 5- or 6-membered ring;

R² is any of the groups for R¹ or represents the atoms which when taken together with X forms a 5- or 6-membered ring;

R³ is a substituted or unsubstituted alkyl group of from 1 to about 6 carbon atoms or a substituted or unsubstituted aryl group of from about 6 to about 10 carbon atoms;

J is CO, CO₂, —SO₂— or CONR⁵—;

R⁴ is a substituted or unsubstituted alkyl or allyl group of from 1 to about 6 carbon atoms or a substituted or unsubstituted aryl group of from about 6 to about 10 carbon atoms; and R⁵ is hydrogen, a substituted or unsubstituted alkyl group of from 1 to about 6 carbon atoms or a substituted or unsubstituted aryl group of from about 6 to about 10 carbon atoms; and at least another of the magenta dyes having the formula:

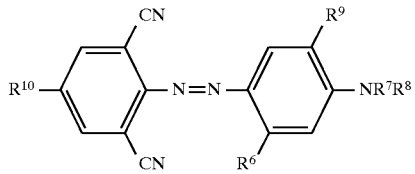

wherein:

R⁶ is a substituted or unsubstituted alkyl group having from 1 to about 4 carbon atoms, an alkoxy group having from 1 to about 4 carbon atoms, an alkylcarbonamido group having from 1 to about 6 carbon atoms or an alkylsulfonamido group having from 1 to about 8 carbon atoms;

R⁷ and R⁸ each individually represent a substituted or unsubstituted aryl group having from about 6 to about 10 carbon atoms, a substituted or unsubstituted alkyl group having from 1 to about 5 carbon atoms, an alkoxyalkyl group having from 3 to about 8 carbon atoms, an aralkyl group having from about 7 to about 10 carbon atoms or a hydroxyalkyl group having from about 2 to about 5 carbon atoms;

R⁹ is hydrogen, halogen, an alkoxy group having from 1 to about 4 carbon atoms or may be taken together with R⁷ or R⁸ to form a 5-or 6-membered heterocyclic ring; and R¹⁰ is hydrogen, a substituted or unsubstituted alkyl group having from 1 to about 8 carbon atoms or an alkoxy group having from 1 to about 4 carbon atoms.

2. The element of claim 1 wherein R¹ and R² in the above formula I are each ethyl, X is OCH₃, J is CO, R³ and R⁴ are each CH₃, and R⁵ is C₄H₉-t.

3. The element of claim 1 wherein R¹ and R² are each ethyl, X is OCH₃, J is CO, R³ is CH₃, R⁴ is CH₂CHOHCH₃, and R⁵ is C₄H₉-t.

4. The element of claim 1 wherein R⁶ in the above formula II is NHCOCH₃, NHSO₂CH₃ or CH₃ and R⁷ is C₂H₅, C₃H₇ or CH₂CH₂OH.

5. The element of claim 1 wherein R⁸ in the above formula II is C₂H₅ or C₃H₇ and R¹⁰ is CH₃ or OCH₃.

6. The element of claim 1 which also contains a yellow dye having the formula:

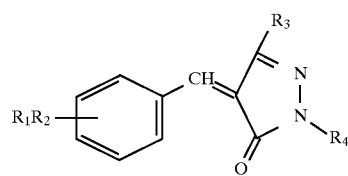

wherein:

R₁, R₂ and R₃ each individually represents hydrogen or a substituted or unsubstituted alkyl or alkoxy group having from 1 to about 4 carbon atoms; and R₄ represents a substituted or unsubstituted aryl group having from 6 to about 10 carbon atoms or a substituted or unsubstituted alkyl group having from 1 to about 4 carbon atoms.

7. The element of claim 1 wherein said dye-donor element contains an infrared-absorbing dye in said dye layer.

8. A process of forming a dye transfer image comprising imagewise-heating a magenta dye-donor element comprising a support having thereon a dye layer comprising a mixture of magenta dyes dispersed in a polymeric binder and transferring a magenta dye image to a dye-receiving element to form said magenta dye transfer image, at least one of the magenta dyes having the formula:

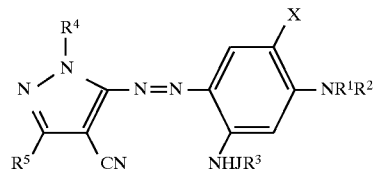

wherein:

R¹ is a substituted or unsubstituted alkyl or allyl group of from 1 to about 6 carbon atoms;

X is an alkoxy group of from 1 to about 4 carbon atoms or represents the atoms which when taken together with R² forms a 5- or 6-membered ring;

R² is any of the groups for R¹ or represents the atoms which when taken together with X forms a 5- or 6-membered ring;

R³ is a substituted or unsubstituted alkyl group of from 1 to about 6 carbon atoms or a substituted or unsubstituted aryl group of from about 6 to about 10 carbon atoms;

J is CO, CO₂, —SO₂— or CONR⁵—;

R⁴ is a substituted or unsubstituted alkyl or allyl group of from 1 to about 6 carbon atoms or a substituted or unsubstituted aryl group of from about 6 to about 10 carbon atoms; and R⁵ is hydrogen, a substituted or unsubstituted alkyl group of from 1 to about 6 carbon atoms or a substituted or unsubstituted aryl group of from about 6 to about 10 carbon atoms; and at least another of the magenta dyes having the formula:

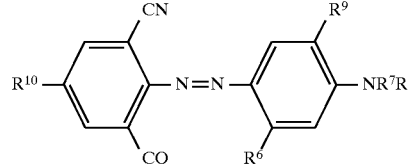

wherein:

R⁶ is a substituted or unsubstituted alkyl group having from 1 to about 4 carbon atoms, an alkoxy group having from 1 to about 4 carbon atoms, an alkylcarbonamido group having from 1 to about 6 carbon atoms or an alkylsulfonamido group having from 1 to about 8 carbon atoms;

R⁷ and R⁸ each individually represent a substituted or unsubstituted aryl group having from about 6 to about 10 carbon atoms, a substituted or unsubstituted alkyl group having from I to about 5 carbon atoms, an alkoxyalkyl group having from 3 to about 8 carbon atoms, an aralkyl group having from about 7 to about 10 carbon atoms or a hydroxyalkyl group having from about 2 to about 5 carbon atoms;

R⁹ is hydrogen, halogen, an alkoxy group having from 1 to about 4 carbon atoms or may be taken together with R⁷ or R⁸ to form a 5-or 6-membered heterocyclic ring; and R¹⁰ is hydrogen, a substituted or unsubstituted alkyl group having from 1 to about 8 carbon atoms or an alkoxy group having from 1 to about 4 carbon atoms.

9. The process of claim 8 wherein $R^1$ and $R^2$ in the above formula I are each ethyl, X is $OCH_3$, J is CO, $R^3$ and $R^4$ are each $CH_3$, and $R^5$ is $C_4H_9$-t.

10. The process of claim 8 wherein $R^1$ and $R^2$ are each ethyl, X is $OCH_3$, J is CO, $R^3$ is $CH_3$, $R^4$ is $CH_2CHOHCH_3$, and $R^5$ is $C_4H_9$-t.

11. The process of claim 8 wherein $R^6$ in the above formula II is $NHCOCH_3$, $NHSO_2CH_3$ or $CH_3$ and $R^7$ is $C_2H$, $C_3H_7$ or $CH_2CH_2OH$.

12. The process of claim 8 wherein $R^8$ in the above formula II is $C_2H_5$ or $C_3H_7$ and $R^{10}$ is $CH_3$ or $OCH_3$.

13. The process of claim 8 which also contains a yellow dye having the formula:

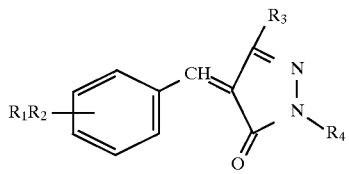

wherein:

$R_1$, $R_2$ and $R_3$ each individually represents hydrogen or a substituted or unsubstituted alkyl or alkoxy group having from 1 to about 4 carbon atoms; and $R_4$ represents a substituted or unsubstituted aryl group having from 6 to about 10 carbon atoms or a substituted or unsubstituted alkyl group having from 1 to about 4 carbon atoms.

14. The process of claim 8 wherein said dye-donor element contains an infrared-absorbing dye in said dye layer.

15. A thermal dye transfer assemblage comprising:

a) a magenta dye-donor element comprising a support having thereon a dye layer comprising a mixture of magenta dyes dispersed in a polymeric binder, and b) a dye-receiving element comprising a support having thereon a dye image-receiving layer, said dye-receiving element being in a superposed relationship with said magenta dye-donor element so that said dye layer is in contact with said dye image-receiving layer, at least one of the magenta dyes having the formula:

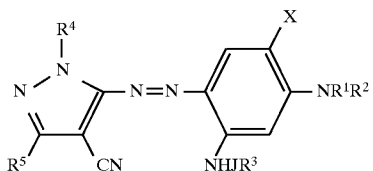

wherein:

$R^1$ is a substituted or unsubstituted alkyl or allyl group of from 1 to about 6 carbon atoms;

X is an alkoxy group of from 1 to about 4 carbon atoms or represents the atoms which when taken together with $R^2$ forms a 5- or 6-membered ring;

$R^2$ is any of the groups for $R^1$ or represents the atoms which when taken together with X forms a 5- or 6-membered ring;

$R^3$ is a substituted or unsubstituted alkyl group of from 1 to about 6 carbon atoms or a substituted or unsubstituted aryl group of from about 6 to about 10 carbon atoms;

J is CO, $CO_2$, $—SO_2—$ or $CONR^5—$;

$R^4$ is a substituted or unsubstituted alkyl or allyl group of from 1 to about 6 carbon atoms or a substituted or unsubstituted aryl group of from about 6 to about 10 carbon atoms; and $R^5$ is hydrogen, a substituted or unsubstituted alkyl group of from 1 to about 6 carbon atoms or a substituted or unsubstituted aryl group of from about 6 to about 10 carbon atoms; and at least another of the magenta dyes having the formula:

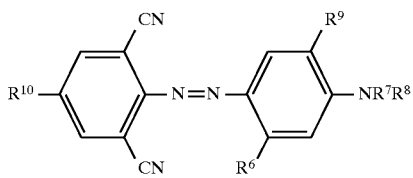

wherein:

R⁶ is a substituted or unsubstituted alkyl group having from 1 to about 4 carbon atoms, an alkoxy group having from 1 to about 4 carbon atoms, an alkylcarbonamido group having from 1 to about 6 carbon atoms or an alkylsulfonamido group having from 1 to about 8 carbon atoms;

R⁷ and R⁸ each individually represent a substituted or unsubstituted aryl group having from about 6 to about 10 carbon atoms, a substituted or unsubstituted alkyl group having from 1 to about 5 carbon atoms, an alkoxyalkyl group having from 3 to about 8 carbon atoms, an aralkyl group having from about 7 to about 10 carbon atoms or a hydroxyalkyl group having from about 2 to about 5 carbon atoms;

R⁹ is hydrogen, halogen, an alkoxy group having from 1 to about 4 carbon atoms or may be taken together with R⁷ or R⁸ to form a 5-or 6-membered heterocyclic ring; and R¹⁰ is hydrogen, a substituted or unsubstituted alkyl group having from 1 to about 8 carbon atoms or an alkoxy group having from 1 to about 4 carbon atoms.

16. The assemblage of claim 15 wherein $R^1$ and $R^2$ in the above formula I are each ethyl, X is $OCH_3$, J is CO, $R^3$ and $R^4$ are each $CH_3$, and $R^5$ is $C_4H_9$-t.

17. The assemblage of claim 15 wherein $R^1$ and $R^2$ are each ethyl, X is $OCH_3$, J is CO, $R^3$ is $CH_3$, $R^4$ is $CH_2CHOHCH_3$, and $R^5$ is $C_4H_9$-t.

18. The assemblage of claim 15 wherein $R^6$ in the above formula II is $NHCOCH_3$, $NHSO_2CH_3$ or $CH_3$ and $R^7$ is $C_2H_5$, $C_3H_7$ or $CH_2CH_2OH$.

19. The assemblage of claim 15 wherein $R^8$ in the above formula II is $C_2H_5$ or $C_3H_7$ and $R^{10}$ is $CH_3$ or $OCH_3$.

20. The assemblage of claim 15 which also contains a yellow dye having the formula:

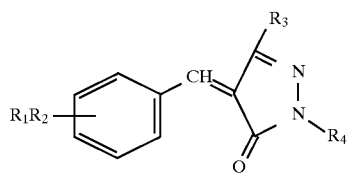

wherein:
  $R_1$, $R_2$ and $R_3$ each individually represents hydrogen or a substituted or unsubstituted alkyl or alkoxy group having from 1 to about 4 carbon atoms; and
  $R_4$ represents a substituted or unsubstituted aryl group having from 6 to about 10 carbon atoms or a substituted or unsubstituted alkyl group having from 1 to about 4 carbon atoms.

* * * * *